US009478723B2

(12) United States Patent
Fowler et al.

(10) Patent No.: US 9,478,723 B2
(45) Date of Patent: Oct. 25, 2016

(54) DUAL PATH THERMOELECTRIC ENERGY HARVESTER

(76) Inventors: Nicholas F. Fowler, Corvallis, OR (US); Marcus S. Ward, Corvallis, OR (US); Paul H. McClelland, Corvallis, OR (US)

(*) Notice: Subject to any disclaimer, the term of this patent is extended or adjusted under 35 U.S.C. 154(b) by 499 days.

(21) Appl. No.: 12/931,287

(22) Filed: Jan. 28, 2011

(65) Prior Publication Data
US 2012/0192910 A1 Aug. 2, 2012

(51) Int. Cl.
*H01L 35/30* (2006.01)

(52) U.S. Cl.
CPC ............................ *H01L 35/30* (2013.01)

(58) Field of Classification Search
CPC ................................................ H01L 35/30
See application file for complete search history.

(56) References Cited

U.S. PATENT DOCUMENTS

| 4,251,291 | A | 2/1981 | Gomez |
| 5,430,322 | A | 7/1995 | Koyanagi |
| 6,539,725 | B2 | 4/2003 | Bell |
| 6,548,750 | B1* | 4/2003 | Picone ............... H01L 35/32 136/203 |
| 6,787,691 | B2 | 9/2004 | Fleurial |
| 6,914,343 | B2 | 7/2005 | Hiller et al. |
| 6,958,443 | B2 | 10/2005 | Stark et al. |
| 7,012,554 | B2 | 3/2006 | Hiller |
| 7,222,489 | B2 | 5/2007 | Pastorino |
| 7,523,617 | B2 | 4/2009 | Venkatasubramanian |
| 7,626,114 | B2 | 12/2009 | Stark |
| 7,629,531 | B2 | 12/2009 | Stark |
| 2005/0115600 | A1 | 6/2005 | DeSteese et al. |
| 2005/0115601 | A1 | 6/2005 | Olsen et al. |
| 2007/0289620 | A1 | 12/2007 | Stark |
| 2008/0173537 | A1 | 7/2008 | DeSteese et al. |
| 2009/0025771 | A1 | 1/2009 | Stark |
| 2009/0025773 | A1 | 1/2009 | Stark |
| 2010/0139291 | A1 | 6/2010 | Hofmeister et al. |

OTHER PUBLICATIONS

C. Kennedy et al., "Development and Testing of High-Temperature Solar Selective Coatings", 2004 DOE Solar Energy Technologies, Oct. 25-28, 2004, Denver CO, pp. 1-2.
C.Kennedy, "Review of Mid- to High- Temperature Solar Selectivce Absorber Materials", NREL/TP-520-31267, Jul. 2002.
B.Zalba et al., "Review on Thermal Energy Storage with Phase Change", Applied Thermal Engineering 23 (2003), 251-283.
R.McCarty, "Energy Harvesting for Wireless Sensors", Marlow Industires, Inc., http://www.marlow.com (accessed 2010).

* cited by examiner

Primary Examiner — Golam Mowla

(57) ABSTRACT

A thermoelectric energy harvester comprises a cyclic energy input terminal supplying heat energy in a first part of the cycle to a thermal storage reservoir through a low thermal resistance generator. During a second part of the cycle, the thermal storage reservoir returns stored heat energy to the environment through an independent thermal circuit and a higher thermal resistance thermoelectric generator.

11 Claims, 8 Drawing Sheets

DUAL PATH THERMOELECTRIC ENERGY HARVESTER

The present invention relates generally to thermoelectric power generation, and more particularly to a thermoelectric generator apparatus and method in which two paths are provided for heat flow to generate electric power.

BACKGROUND

To harvest energy via a thermoelectric device, the thermal energy must be passed through a thermoelectric conversion device. Conventionally, the thermoelectric generator is provided a low thermal resistance so that heat is transferred from a high temperature source to a low temperature heat sink with the most energy per ΔT (temperature difference between the hot and cold sides of the thermoelectric generator) being harvested. It is known that a heat sink such as that provided by the earth (in terrestrial applications) is large with respect to its heat sinking capability, but high efficiency applications require consistent heat sinking capability without regard to depth, variable soil types, and degree of hydration.

Some implementations, particularly for space and extraterrestrial situations, have made use of the fact that once the sun is occluded, the ambient temperature becomes significantly colder than the heat storage element. Electric energy is generated as the thermoelectric generator is, in effect, run in reverse and the heat energy stored in the heat storage element is exhausted to the ambient. An early patent to Gomez, U.S. Pat. No. 4,251,291, discloses a latent heat storage medium that stores heat collected by an absorber plate during the day and releases the stored heat during the night from the same absorber plate. During both parts of the thermal cycle, the heat flow is directed through thermopiles for generation of electricity.

U.S. Pat. No. 6,914,343 to Hiller et al. discloses a thermoelectric generator that employs a phase change mass as a thermal storage element with a thermoelectric module disposed between the thermal storage element and the environment. During the hot part of a thermal cycle, heat is taken from the environment and routed through the thermoelectric element to the thermal storage element, where the phase change mass is partially or completely melted. During the cold portion of the thermal cycle, heat is extracted from the thermal storage element, passed through the thermoelectric module, and dissipated to the environment. The phase change mass is partially or completely frozen at the conclusion of the cold portion. However, the temperature of the phase change mass is expected to remain relatively constant during both parts of the thermal cycle. An electric circuit enables the electric current produced by the thermoelectric generator to flow in a single direction to an electric storage device, regardless of the direction of heat flow through the thermoelectric generator.

U.S. Patent Application Publication No. 2005/0115600 by DeSteese et al. discloses a thermoelectric power source that utilizes two regions exhibiting a temperature difference between the regions. A thermoelectric device exploits the temperature gradient across the device to generate an electric current. DeSteese et al. describe a thermoelectric generator that employs discrete columnar thermocouple elements disposed in a cross-planar configuration, which has a low voltage output characteristic of a low length to cross sectional area ratio (L/A=λ) of the columnar thermocouple elements. Heat flux is introduced perpendicular to the plane of cross section of the columns. A step-up voltage converter is shown to be necessary to satisfactorily employ a cross-planar configuration when the temperature gradient is small. However, such small temperature gradients have not heretofore enabled efficient conversion of heat energy to electrical energy DeSteese et al. prefer a plethora of thin film thermocouples with a high L/A ratio disposed on a film substrate in an in-plane configuration. This configuration generates a higher voltage with small temperature gradients. A thin film thermoelectric generator is used by DeSteese et al. and includes alternating strips of n-type and p-type semiconductor material connected in electrical series. Heat flux is caused to flow in the direction of the plane of the thin film.

The λ ratio of an in-plane configuration determines both the thermal and the electrical characteristics of the in-plane thermoelectric generator. See McCarty, Marlow Industries, Inc., *Energy Harvesting for Wireless Sensors*, www.marlow.com/applications/power-generation/energy-harvesting.html (2010). The ratio between the thermal resistance of the thermoelectric generator, $R_{TEG,th}$, and the remainder of the system thermal resistances, primarily hot side thermal resistance, HSR, and cold side thermal resistance, CSR, is given by:

$$m = \frac{R_{TEG,th}}{HSR + CSR} \qquad \text{eq. 1}$$

The electrical resistance of a single in-plane thermocouple element (of the Plethora of in-plane thermocouples disclosed by DeSteese et al.) is given by:

$$R_{TEG,el} = \lambda(\rho_p + \rho_n), \qquad \text{eq. 2}$$

where $\rho_p$ is the electrical resistance of the p-type semiconductor, and $\rho_n$ is the electrical resistance of the n-type semiconductor.

Maximum power is realized from an in-plane thermoelectric generator when the resistance of the in-plane thermoelectric generator and the load resistance are matched. That is, for a selected number, N, of in-plane thermocouple elements and a selected load resistance ($R_{load}$), the ratio n=1 where:

$$n = \frac{R_{load}}{N \cdot R_{TEG,el}} \qquad \text{eq. 3}$$

and when the thermal resistance, m=1.
With these conditions met, the output voltage is:

$$V = \frac{N\alpha(T_{source} - T_{ambient})}{4} \qquad \text{eq. 4}$$

where α is the Seebeck coefficient.

In-plane and cross-plane thermoelectric generators are further disclosed in U.S. Pat. No. 7,626,114 to Stark. A cross-plane configuration is shown in FIG. 1, and an in-plane configuration is shown in FIG. 2. Stark discloses a cross-plane thermoelectric generator 101 that offers a relatively low electrical resistance due to a conventionally small number of thermocouples 103, which are coupled by metal contacts 104 in an electrically series orientation and a small ratio of length to cross section area of n-type 105 and p-type 107 semiconductor columns that generate electricity from a thermal differential. The low resistance results in a high current output capability with low output voltage. This voltage becomes sufficient to drive a step-up voltage converter when a large heat flux is passed through the plane of the cross section area. Stark also discloses an in-plane thermoelectric generator 201, as shown in FIG. 2, in which a large number of long and thin n-type and p-type thermoelectric legs, 203, 205 respectively, are disposed parallel to each other on a substrate and electrically connected together in series via metalizations 206. The ratio of the length to thickness of the semiconductor legs results in the amount of heat flowing (in the plane of the substrate 207) through the in-plane thermoelectric generator being relatively small. Moreover, the large number of thermocouple elements connected in series and the ratio of length to thickness of the legs results in a high electrical resistance and a low power output. The depiction of the in-plane thermoelectric generator of FIG. 2 illustrates one p-type and one n-type thermocouple. Conventionally, the large number of thermocouples is rolled up into a cylindrical shape for a thermoelectric generator.

Stark discloses that one cross-plane and one in-plane thermoelectric generator may be operated together with a suitable power management apparatus. The voltage converter of Stark is designed to convert the low voltage, high power output from a cross plane thermoelectric generator into a higher voltage using voltage multiplication in the manner of a charge pump. Thus, the higher voltage needs of the other energy management systems, and the voltage converter, itself, are met. Stark's apparatus, using the same heat source and heat sink for both thermoelectric generators, does not provide the highest efficiency in harvesting all of the available heat energy, particularly when a day-night thermal cycle is involved.

When a day-night thermal cycle is considered—where the day part of the cycle provides a relatively large thermal flux and the night part of the cycle provides a relatively small thermal flux in the opposite direction (from heat energy stored in a thermal storage)—a problem of efficiently utilizing both the high level of heat flux and the low level of heat flux persists in the current technologies. It would be desirable that a technique be devised to optimally convert the high level and the low level heat flux into electric power. A thermoelectric generator is needed that can efficiently generate high electric current as the heat energy is stored in a heat energy storage element. A thermoelectric generator is also needed that can discharge heat energy and generate a relatively high voltage with the low heat flux experienced during the discharge of the heat energy storage during the cold part of the thermal cycle.

Electric circuitry has been devised to operate with this bidirectional flow of heat. However, when the heat flux from the storage element to the ambient is low, as would occur in a terrestrial day-night cycle, the efficiency of the electric circuitry has proven to be undesirably low because the magnitude of the voltage supplied is a small value for conventional thermoelectric generators. Accordingly, it would be desirable to generate the highest open circuit voltage possible, particularly during the cold portion of the thermal cycle, thereby improving power conversion efficiency in a thermoelectric generator.

SUMMARY

An apparatus for generating electrical power from a thermal differential includes a thermal reservoir in which thermal energy is stored. A first thermoelectric generator and a second thermoelectric generator are thermally coupled between the thermal reservoir and a heat source terminal or a heat sink terminal. The first thermoelectric generator has a first thermal resistance and the second thermoelectric generator has a second thermal resistance, where the first thermal resistance has a value less than a value of the second thermal resistance.

DETAILED DESCRIPTION

Figure 1:
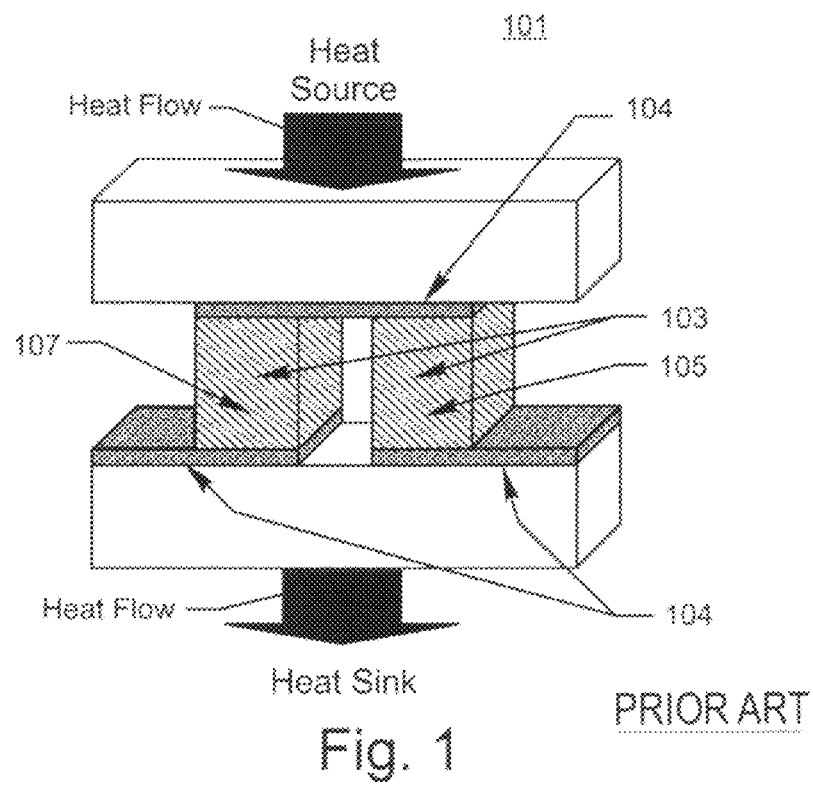
FIG. 1 is a perspective drawing of a conventional cross-plane thermoelectric generator.

In order to harvest the greatest amount of energy available from a cyclic heat source, such as the sun at an earth-based location, a dual path thermoelectric generator has been created to provide maximum electric current during one portion of the thermal cycle and a suitably high open circuit voltage during the other portion of the thermal cycle.

Thermoelectric generating devices exhibiting low thermal resistance typically transfer more heat and consequently harvest more energy for a given temperature differential ($\Delta T$) across a thermoelectric generating device than a high thermal resistance thermoelectric generating device if the applied temperature differences to the units are comparable. In a solar application the maximum available energy is the highest available temperature in a sun-facing "hot" side absorber plate transferring heat to a large thermal sink on the "cold" side. For practical applications, soil contact on the cold side is not consistent, but a fluid reservoir thermally connected to the cold side has a predictable amount of thermal storage available based upon material, mass, and the isolation of the system. If the cold side heat storage system comprises a phase change material (a latent energy storage device) a plateau in the temperature rise of the cool side occurs at the phase change transition temperature as energy is absorbed, thus extending the available $\Delta T$ for the device.

Further, if the heat energy storage is optimally sized, the energy collected during the day portion of a day-night thermal cycle will be stored in the heat energy storage reservoir as a temperature rise and a phase change of the heat energy storage reservoir without reliance upon an earth thermal sink.

In practical cases the temperature rise in the heat storage reservoir must not be allowed to rise too close to the hot side temperature or the ΔT will not support power harvesting (extraction) during the time of highest potential extraction since heat flux is a function of ΔT, as shown in eq. 4. However, for later power recovery (night time) the hotter the heat storage reservoir is, the more energy is available for harvesting during the night time of the cycle. Storing some of high flux energy in a phase change material holds the heat storage reservoir temperature constant for a longer time. However, if the heat energy is returned back through the solar heat input path, the available energy will be rapidly dissipated to the environment at lower efficiency because only a low voltage is generated by the low thermal resistance thermoelectric generator due to the lower ΔT. In one embodiment in a moderate terrestrial environment, a solar absorber plate in a solar oven will reach a temperature of 130° C., warm a phase change heat energy storage element to a phase transition temperature of 60° C., thereby creating a ΔT of 70° C. across a low thermal resistance thermoelectric generator. However, the night portion of the day-night thermal cycle does not produce a ΔT of 70° C. as the heat energy storage reservoir dissipates heat energy to the environment. Returning the stored energy through a high thermal resistance thermoelectric generator will maintain a higher ΔT for a longer time at a reduced current. The high thermal resistance thermoelectric generator provides an advantage of higher output voltage and enables a higher efficiency of power management and voltage conversion circuitry. Thus, the present invention maximizes current at modest voltage during times of high available ΔT and supplies maximum voltage at lower current during the return cycle.

Figure 3:
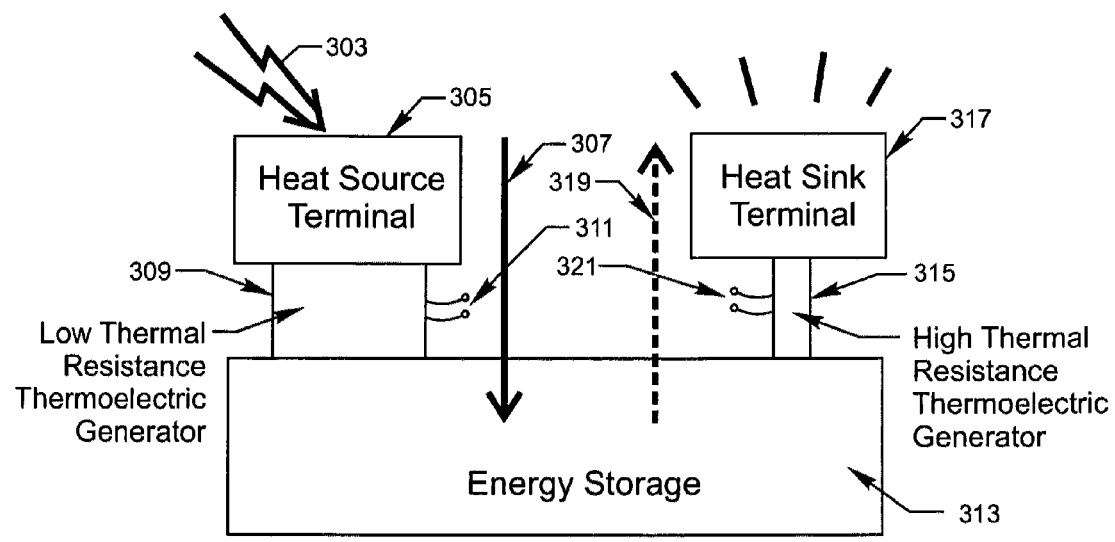
FIG. 3 is a simplified block diagram of a dual path thermoelectric energy harvester.

Turning now to FIG. 3, a simplified block diagram discloses an elemental concept of the present invention. Heat energy, represented by 303, impinges upon a heat source terminal 305, which collects the heat energy for subsequent use in the storage of energy and the generation of electricity. The heat energy is caused to flow, as depicted by heat flux solid arrow representation 307, from the heat source terminal 305 through a low thermal resistance thermoelectric generator 309, thereby generating electricity, which is coupled to electric terminals 311. The heat energy is coupled to an energy storage element 313, where the energy is stored as a temperature rise of the material comprising the energy storage element and, depending upon the material, a phase change of the material.

As is well known, the magnitude of the heat flux 307 (and the magnitude of the generated voltage) is related to the temperature difference between the heat source terminal 305 and the energy storage element 313. See, for example, eq. 4, above.

When the temperature of the energy storage element exceeds the temperature of the heat source terminal 305 and the ambient, such as after the sun sets for the day, the direction of the heat flux reverses and electricity can be generated if the heat energy is allowed to be radiated by the heat source terminal 305. Since the temperature difference between the heat source terminal 305 and the energy storage element 313 for terrestrial applications is most often relatively small, the magnitude of the electricity generated is correspondingly small and the voltage is low such that voltage step-up and regulation is inefficient. Control electronics coupled to the electric terminals becomes increasingly inefficient as the voltage level output from a low thermal resistance thermoelectric generator operating at low thermal flux levels becomes smaller.

In order to overcome these inefficiencies, a high thermal resistance thermoelectric generator 315 is coupled, at one end, to the energy storage element 313, and is coupled at the opposite end to a heat sink terminal 317. When the energy storage element is at a higher temperature than the ambient, heat flux, represented by dashed arrow 319, flows from energy storage element 313 through high thermal resistance thermoelectric generator 315 to heat sink terminal 317 for radiation to the ambient. Although the magnitude of heat flux 319 is lower than the magnitude of heat flux 307 and the amount of electrical power generated is correspondingly smaller, the high thermal resistance of high thermal resistance thermoelectric generator 315 creates a higher voltage. This higher voltage, greater than 100 mV in one embodiment, is much better suited to the needs of the control electronics coupled to electric terminals 321 of the high thermal resistance thermoelectric generator 315.

Figure 4:
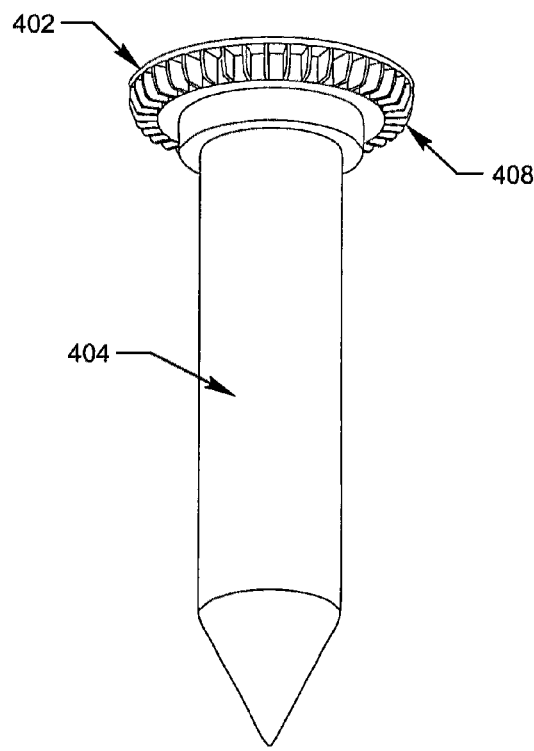
FIG. 4 is a perspective drawing of a dual path thermoelectric generator that may employ the present invention.

One embodiment, which enjoys the benefits of the present invention, is shown in the perspective drawing of FIG. 4. Simply stated, a heat source terminal is embodied in a flat structure 402 that includes a solar absorber and a bottom surface. The solar absorber is preferably coated with a layer that favorably absorbs solar energy in the ultraviolet, visible, and near infrared and favorably reflects lower temperature heat in the far infrared. The bottom surface is thermally coupled to a low thermal resistance thermoelectric generator that is, in turn, housed in a cylindrical stake-point housing 404. The heat pipe is surrounded by a heat storage material, which is contained within the housing 404. In this embodiment, the heat energy storage material is thermally coupled via a second heat pipe to a high thermal resistance thermoelectric generator by way of the heat pipe 404 that is coupled to a heat sink terminal 408. The prominence of the heat sink 408 may be varied in accordance with the desired performance and environmental application of the dual path thermoelectric energy harvester. As illustrated in FIG. 4, the heat sink 408 extends radially beyond the radius of the heat source terminal structure 402. However, the heat sink may alternatively be disposed under, and in the shade of, a larger sized heat source terminal structure 402.

Figure 5:
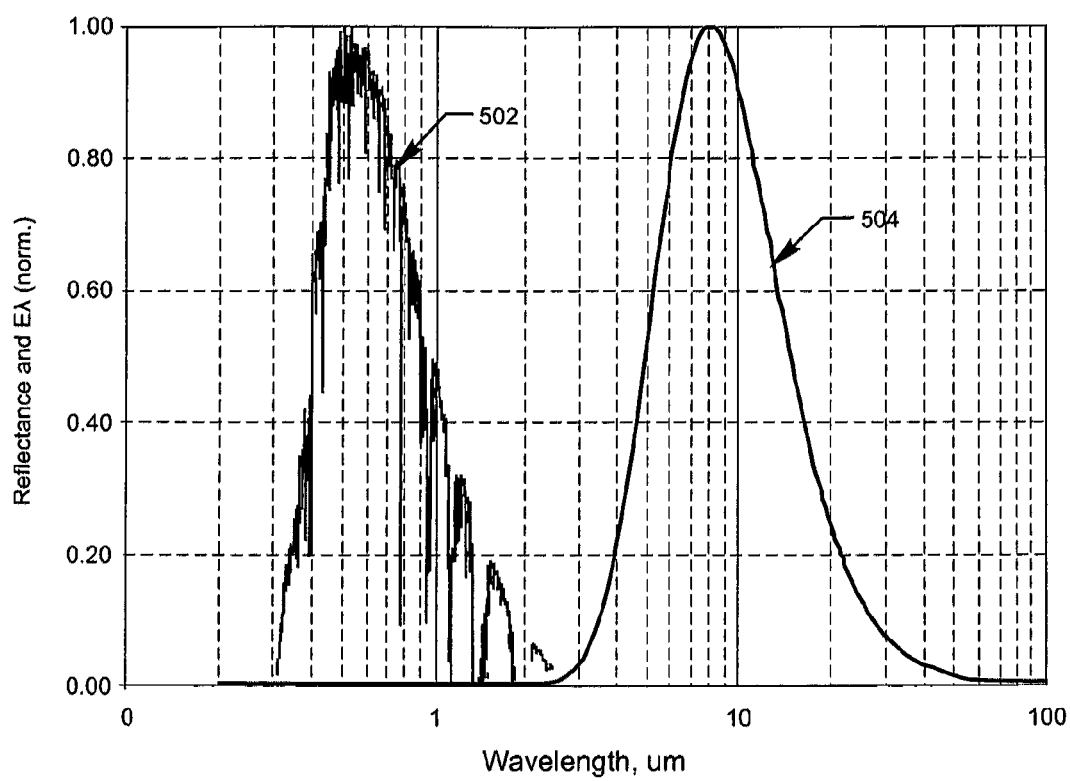
FIG. 5 is an acceptance/emittance versus wavelength graph of the performance of a typical spectrally selective surface.

The sun-facing surface of the absorber is coated with a spectrally selective layer, which in this embodiment is a selective black silicone-based solar collector coating available from Dampney Company, Inc. of Everett Mass., but the spectrally selective layer alternatively can be a chemical copper oxide or multilayer thin film depositions. A desirable spectrally selective surface is one which has a low reflectance in the spectrum in which the heat source terminal is to operate—in the present application, the solar spectrum—and a high thermal reflectance at the temperatures at which an absorber plate of the heat source terminal operates. Thus, the spectrally selective layer enables the acceptance of energy incident on the absorber plate during the high irradiation periods of the daylight hours and operates to prevent radiation of cooler temperature heat energy from the heat energy reservoir during the night time portion of the thermal cycle. Performance of a spectrally selective surface useful in the present invention is shown in the graph of FIG. 5. The solar emittance curve 502—shows normalized energy absorption at wavelengths between 0.35 μm and 2 μm (corresponding to Solar input, Air Mass 1.5). The reflectance response curve 504 represents normalized reflectance indicative of high acceptance of AM1.5 radiation and significant radiation inhibition at wavelengths between 4 μm and 12 μm, wavelengths that represent radiation from black body radiators at temperatures of 400° C. to 0° C. Thus, the spectrally selective layer is adjusted to be absorptive in a band of wavelengths encompassing visible and near infrared radiation and non-emissive in a band of wavelengths encompassing black body peak radiation at temperatures selected to include the phase transition temperature of the thermal reservoir phase change material. The night time operation is of particular interest since it is desired that radiation from the heat source terminal be minimized in favor of radiation by the heat sink terminal 408.

Figure 6:
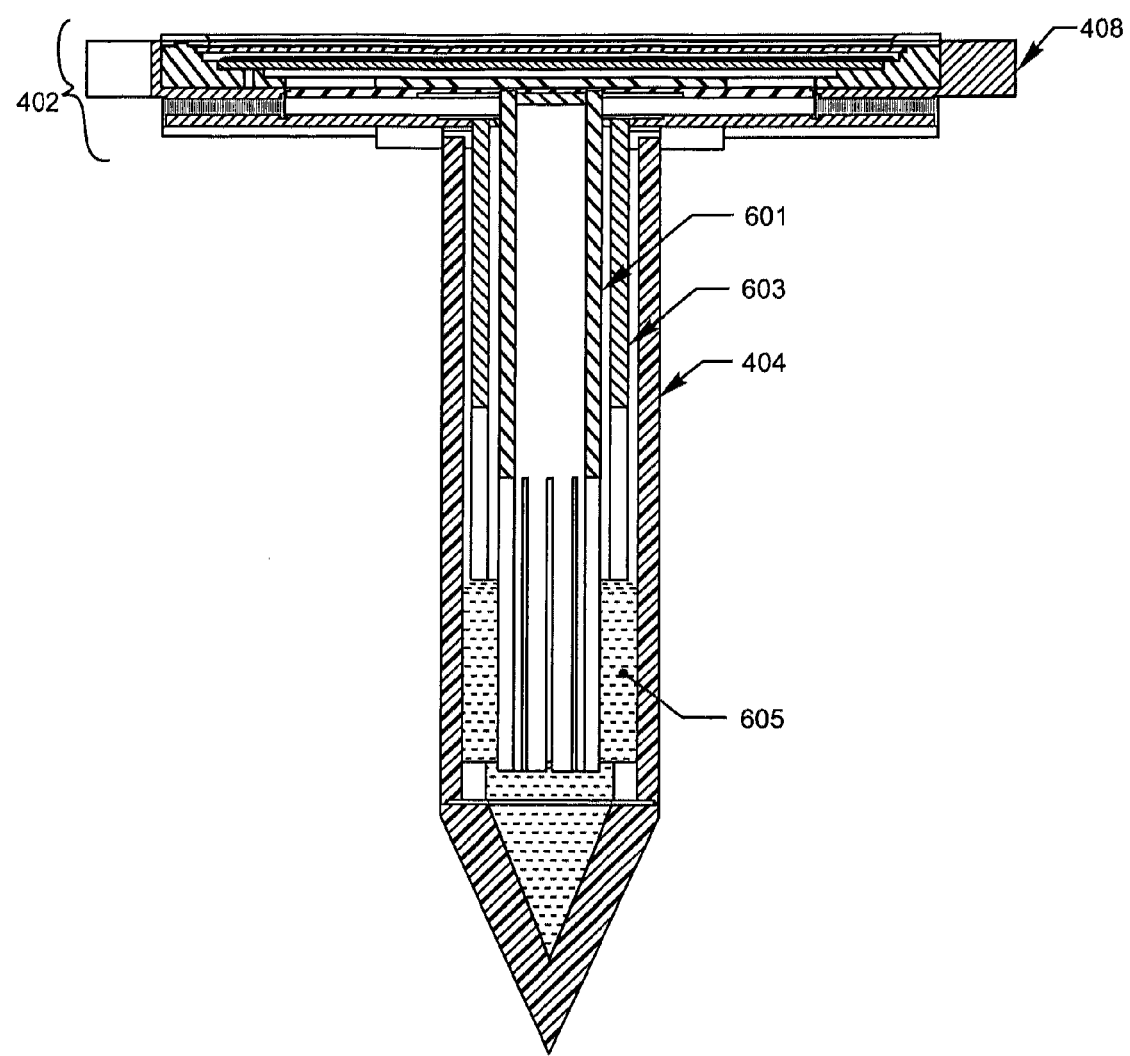
FIG. 6 is a cross section of the dual path thermoelectric generator of FIG. 4, taken along the axis of the cylindrical stake-point housing and illustrating the assembly of a solar oven box, a low thermal resistance path, and a high thermal resistance path that may be employed in the present invention.
Figure 7:
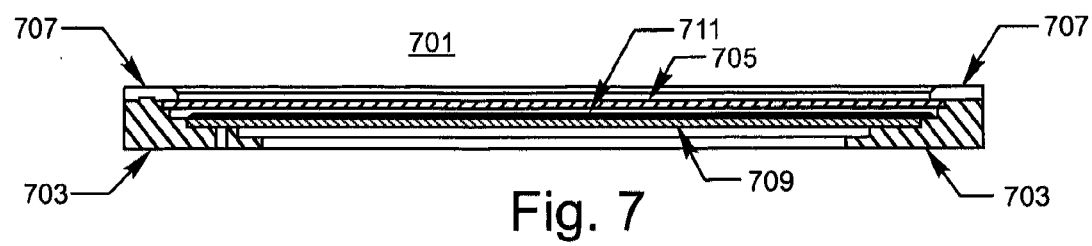
FIG. 7 is a cross section of a solar oven portion of a heat source terminal that may be employed in the present invention.
Figure 8:
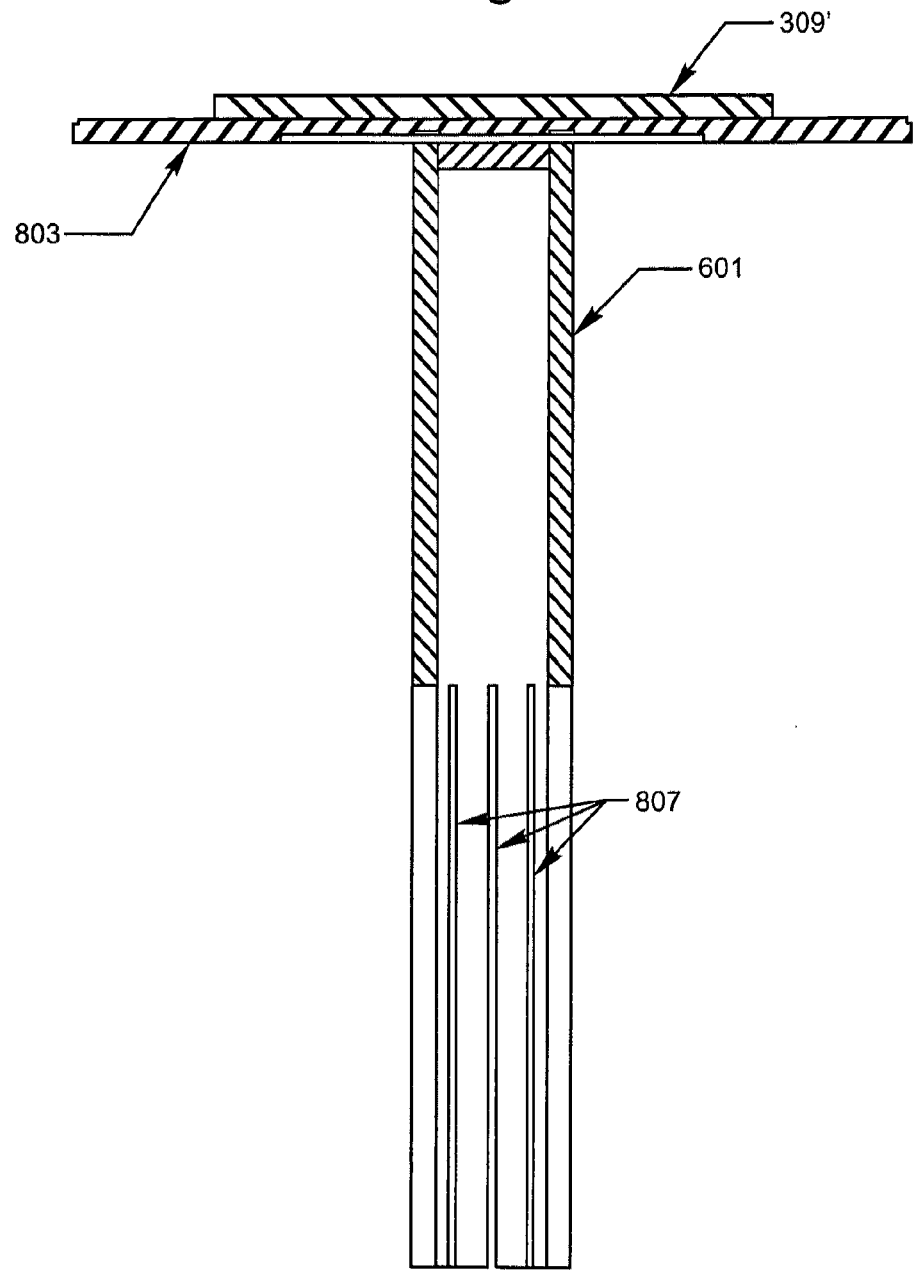
FIG. 8 is a cross section of a low thermal resistance thermoelectric generator and heat pipe portion of a heat source terminal that may be employed in the present invention.
Figure 10:
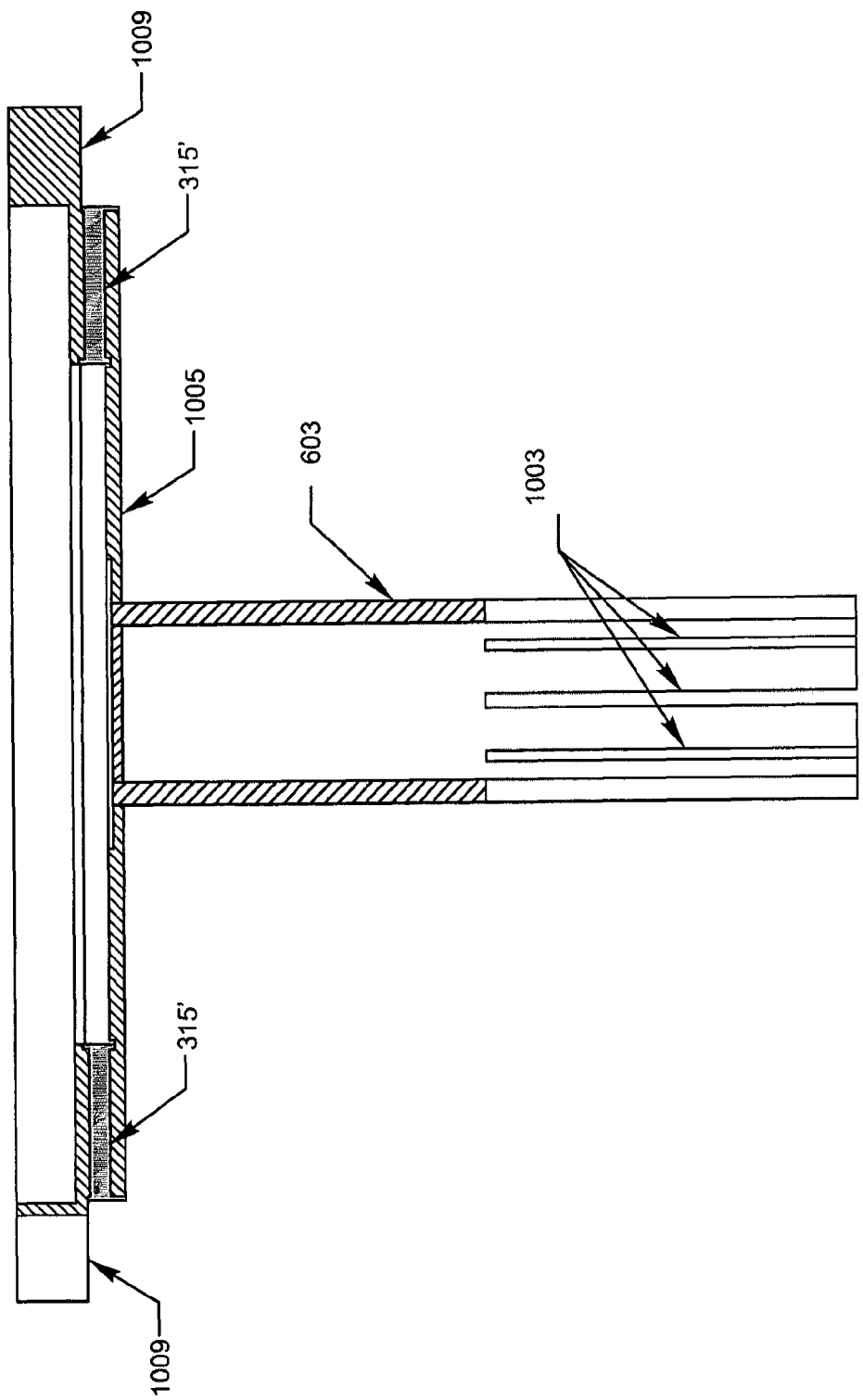
FIG. 10 is a cross section of a high thermal resistance path that may be employed in the present invention.

A cross section of the dual path thermoelectric energy generator of FIG. 4, taken along the axis of cylindrical stake-point housing 404, is shown in FIG. 6 and is described below. To aid in understanding, this energy harvester is divided into functional segments as shown in FIGS. 7, 8, and 10. These segments are a heat source terminal portion, a low thermal resistance portion, and a high thermal resistance portion.

Assembled as shown in FIG. 6, a thermally insulating pointed stake housing 404 surrounds an inner heat pipe 601 and an outer heat pipe 603. While one embodiment employs tubes having a circular cross section operating as heat pipes, the process of transporting heat energy from one location to another via what is conventionally known as a heat pipe should not be taken as meaning only such a tube structure. Heat pipes may also be arranged as solid or hollow structures of any appropriate cross sectional shape, including flat plate structures. A heat storing material is enclosed within the volume of the stake housing 404 and is thermally decoupled from ambient by the stake housing 404. Stake housing 404 preferably comprises schedule 80 PVC or CPVC pipe (polyvinyl chloride/chlorinated polyvinyl chloride pipe), which has advantageous properties such as low thermal conductivity, light weight (with wall thickness of 3/16 inch), and low cost although any thermally insulating housing having insulating and strength characteristics may advantageously be employed.

Additional heat energy can be extracted from the energy storage element 313 during the cold portion of the thermal cycle if the heat storage material were a phase change material. Therefore, in one embodiment, the heat energy storing material is a phase change material of a paraffinic wax, used because it has a phase change temperature of 60° C., compatible with the expected range of temperatures expected at the absorber plate 709. Other materials of interest for other temperature ranges include hydrated salt solutions such as $NaNO_3$. An extensive list of phase change materials and their melting temperatures is described by Zalba, Marin, Cabeza, and Mehling, *Review on Thermal Energy Storage with Phase Change: Materials, Heat Transfer Analysis, and Applications*, Applied Thermal Engineering 23, 2003, pp. 251-283.

The Heat Source Terminal

A cross section of an embodiment of a solar oven portion of a heat source terminal is shown in FIG. 7. An embodiment of the present invention employs a solar oven box 701. As shown in the cross section of FIG. 7, the solar oven box comprises a frame 703 which supports a "white" glass sheet 705 that is, in one embodiment, 3 mm thick and secured in place with an anodized aluminum glass clamp 707. An air gap is formed between the glass sheet 705 and an anodized aluminum absorber plate 709, which are spaced apart by a ring or spacer. The absorber plate 709 is coated on its sun-facing surface with a spectrally selective layer 711 in order to enable an efficient conversion of the solar insolation to heat energy while reducing radiative loss. Under typical full-sun conditions, the absorber plate 709 reaches, in one embodiment, an approximate temperature of 130° C.

The absorber plate 709 is held in physical contact with a low thermal resistance thermoelectric generator shown in FIG. 8, and good thermal communication is maintained between them with a thermal coupling compound. The low thermal resistance thermoelectric generator 309' is shown in the cross section in FIG. 8 along with a heat pipe to transmit the heat energy from the low thermal resistance thermoelectric generator 309' to the heat storage reservoir. The top surface of low thermal resistance thermoelectric generator 309' is thermally coupled to the bottom surface of the absorber plate 709 with a low thermal resistance coupling compound such as silver particle filled low viscosity paste. The opposite side of the thermoelectric generator 309' is also coated with the thermal coupling compound and secured to a heat conductor plate 803. The heat conductor plate 803 is attached to a heat pipe 601 in a manner that reduces heat energy loss at the point of attachment. One embodiment utilizes a slip-fit interference fit having low thermal resistance offered by the thermal coupling compound or, alternatively, secured with a thermally conducting epoxy. Also, the heat pipe 601 in the embodiment shown in FIG. 8, employs an aluminum tube 20 cm long and 2.6 cm in outside diameter, with a wall thickness of 4 mm. For 10 cm, the heat pipe 601 wall is solid and for the remaining 10 cm the wall is permeated with six slots 807 disposed parallel to the axis of the heat pipe 601. In operation, the heat pipe 601 is surrounded by a heat energy-storing phase change material that, in one phase, is a liquid. In order that the liquid be reasonably mixed and in thermal equilibrium throughout its extent, the slots supply the function of self-mixing through liquid convection fostered by the slots. Thus, localized solidification of the liquid in direct contact with heat pipe 601 is minimized.

Solar heating is captured by the solar oven box 701 and transferred to the thermal storage reservoir, which may contain a phase change material by way of the low thermal resistance thermoelectric generator 309' and heat pipe 601.

Figure 9A:
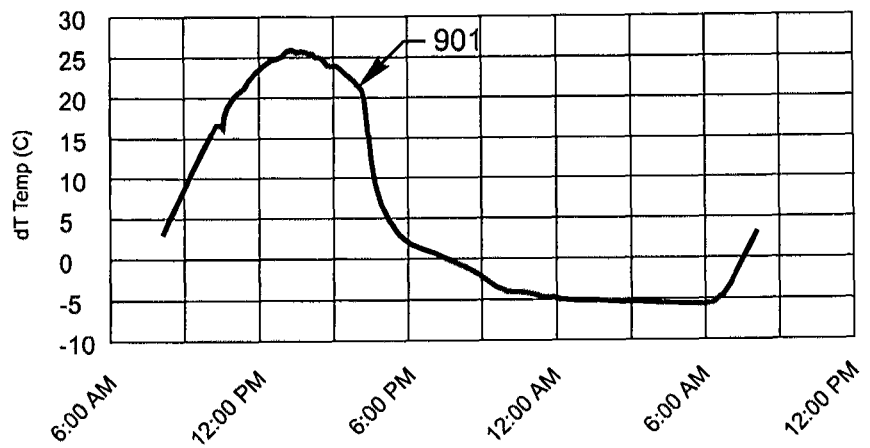
FIGS. 9A and 9B are a $\Delta T$ versus time graph and a generated voltage versus time graph, representing one complete heating/cooling cycle.
Figure 9B:
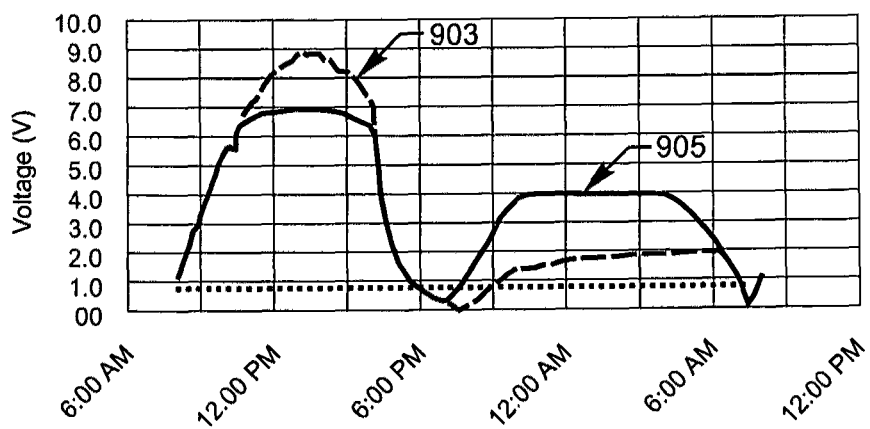

FIGS. 9A and 9B show the variation of ΔT, the temperature difference across the low thermal resistance thermoelectric generator 309 and the open circuit voltage magnitude generated by the low thermal resistance thermoelectric generator 309 when operating in a temperate climate over the period of one day, that is, one thermal cycle. It is to be observed that the effect of a heat energy storage element that employs a phase change material as the heat energy storage mechanism, thus maintaining a higher voltage during the night portion of the thermal cycle is apparent in curve 905.

As shown in the temperature versus time curve 901 of FIG. 9A, representing a complete heating/cooling cycle of the energy storage material (such as would be experienced over a 24 hour terrestrial day in a solar powered generator) the temperature climbs as the energy source, the sun, commences insolation of the heat source terminal of the thermoelectric generator. Once a ΔT greater or less than zero is available, the low thermal resistance thermoelectric generator 309 generates a voltage, as seen in FIG. 9B.

If a phase change material is utilized in the heat energy storage element, a leveling of the ΔT at a phase transition temperature, $T_\phi$, is experienced as long as the phase change material is converted from, for example, solid to liquid form. Phase change materials release a large quantity of energy around temperatures in the vicinity of their phase change temperature. The advantage of the phase change from one phase to another for the present invention is realized during the night portion of the thermal cycle, where a higher ΔT is maintained as the phase change material changes from liquid to solid form and releases heat energy. Voltage generated when a conventional ground connected heat storage medium is employed is illustrated in curve 903. The effect of an insulated phase change material heat storage is observed in curve 905, where the voltage is somewhat reduced during the high power solar charging portion of the thermal cycle but the voltage is significantly higher during the re-radiative portion of the thermal cycle.

In order to more advantageously employ the lower heat flux present during the night time part of the cycle, a dual path thermoelectric energy harvester employs a high thermal resistance thermoelectric generator 315, which produces a higher electrical voltage with the low heat flux. One embodiment employs a second heat pipe, thermoelectric generator, and heat dissipator (heat sink). This arrangement is an integral part of the energy harvesting thermoelectric generator of FIG. 4 but is shown in an isolated cross section of FIG. 10. A second heat pipe, outer heat pipe 603, in one embodiment, is disposed coaxially with heat pipe 601 in the phase change medium of the energy storage element, comprises an aluminum tube 15 cm long with an outside diameter of 4.2 cm and a wall thickness of 5 mm. Slots 1003 are disposed parallel to the heat pipe axis for a distance of 7.6 cm from the free end of the heat pipe 1001. The other end is interference fit or epoxied with a thermally conducting epoxy into heat conductor plate 1005. The heat conductor plate 1005 is maintained in thermal communication with one side of high thermal resistance thermoelectric generator 315'. As previously described, the high thermal resistance thermoelectric generator comprises a multiplicity of thermocouples disposed on a film and wound into a cylindrical shape. In one embodiment, as shown in FIG. 10, the high thermal resistance thermoelectric generator cylinder has a central opening through which the heat conductor plate 803 is disposed without thermal communication in the completed assembly of the dual path thermoelectric energy harvester of FIG. 6. A heat sink radiator 1009 is thermally coupled to the opposite side of the thermoelectric generator 315' and used to radiate heat energy to ambient.

The High Thermal Resistance Thermoelectric Generator Portion

Figure 2:
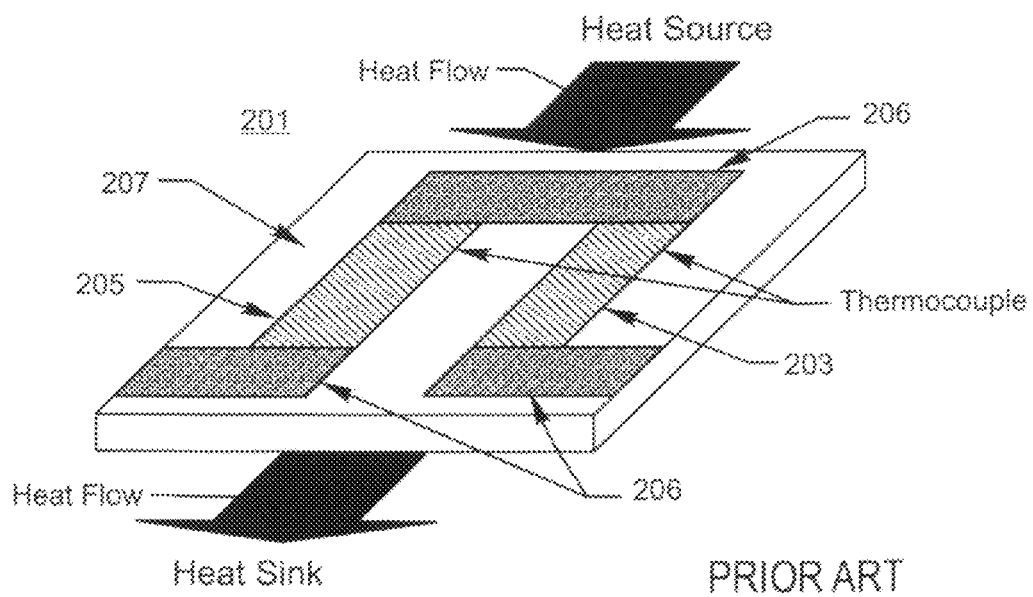
FIG. 2 is a perspective drawing of a portion of a conventional in-plane thermoelectric generator.

A high thermal resistance thermoelectric generator element 315, such as that disclosed in U.S. Pat. No. 7,626,114 and discussed above as an in-plane thermoelectric generator, may advantageously be used in the present invention. The present invention employs a high thermal resistance thermoelectric generator having a thermal resistance of between 25 to 60 K/W-m, a height of 2 to 4 mm, and at least 2250 thermocouples. As described in association with FIG. 2, n-type and p-type thermocouple films (203 and 205, respectively) are electrically coupled alternately in series. One embodiment employs the n-type and p-type thermocouple legs that have substantially equal lengths and widths, however, the thermoelectric generator 315 may be configured such that the n-type and p-type thermocouple legs are of differing lengths and/or widths. The substrate, upon which the film thermocouple legs are disposed, is a flexible material so that it can be wound or rolled into a cylinder which is then sandwiched between two heat coupling plates so that heat energy applied to one of the plates is conducted via the thermocouple legs to the other heat coupling plate. A large number of thermocouple pairs are capable of being wound into the cylinder, thereby offering a high thermal resistance and enabling the electrically series connection to provide a relatively large output resistance. It is contemplated that the multitude of thermocouple legs may number between 500 and 10,000 thermocouple pairs, with a preference of about 200-5000 electrically series-coupled thermocouples for the high thermal resistance thermoelectric generator 315.

The ratio of thermocouple length to film cross section is large, resulting in relatively high resistance for each individual thermocouple. High thermal resistance restricts the amount of heat flow through the thermoelectric generator and high electrical resistance limits the amount of electrical power that can be generated. Nevertheless, a relatively high voltage, for example 500 to 1000 mV, is generated with the low heat flow at 1° C. difference. This effect can be advantageously exploited in a dual path thermoelectric energy harvester that experiences different rates of heat flow depending upon the time of day, the subject device employing the present invention.

The thermocouple material employed in one embodiment of the high thermal resistance thermoelectric generator of the present invention for the n-type and p-type thermocouple legs comprises a semiconductor compound of bismuth telluride ($Bi_2Te_3$) and antimony telluride ($Sb_2Te_3$). However, the specific compositions of the semiconductor compound may be altered to enhance or modify the thermoelectric performance of the n-type and p-type thermocouple leg.

For the thermoelectric generator having the above-noted mechanical and electrical properties, a temperature differential between the top and bottom plates of 10° C., generates an open-circuit voltage output of about 4V with a current of about 100 μA.

The Low Thermal Resistance Thermoelectric Generator Portion

The low thermal resistance thermoelectric generator 309' comprises a plurality of p-type and n-type polycrystalline material thermocouples coupled electronically together in a series configuration to generate electric power by the Seebeck effect. As shown in the aforementioned FIG. 1, heat energy is introduced at one heat couple plate and extracted from the other heat couple plate, with the thermocouples disposed in a cross-plane configuration between the two heat couple plates. Thus, the heat flux flows through the parallel arrangement of thermocouples, where such an arrangement offers a small thermal resistance and the dimensions of the thermocouples result in a relatively high electrical power output. For example, when the ΔT across the low thermal resistance thermoelectric generator is 50° C., the output current is 500 mA at a voltage of 2V. However, when the ΔT is only 5° C., the output voltage is about 100 mV, which is below the threshold of useful voltage step-up. Despite the capability for high power output, the number of thermocouples that can be accommodated in a device of practical dimensions is a limited number and thus results in a low voltage output at small ΔT conditions. Moreover, the limited number of thermocouples causes the output resistance of the thermoelectric generator to have a low electrical resistance value. Another type of resonant DC to DC boost circuit has been developed by Linear Technologies (LTC 3108) that has very low input resistance and 20 mV turn-on capability. These units are 50 to 60% efficient at input voltages below 150 mV and drop to 20% above that. Thus over a cyclic operating period, their efficiency is compromised at one end or the other.

In one embodiment, a low thermal resistance thermoelectric generator with a thermal resistance of between 2 to 5 K/W-m, 3.5 mm height and 127 thermocouples is used.

The Control Electronics

Figure 11:
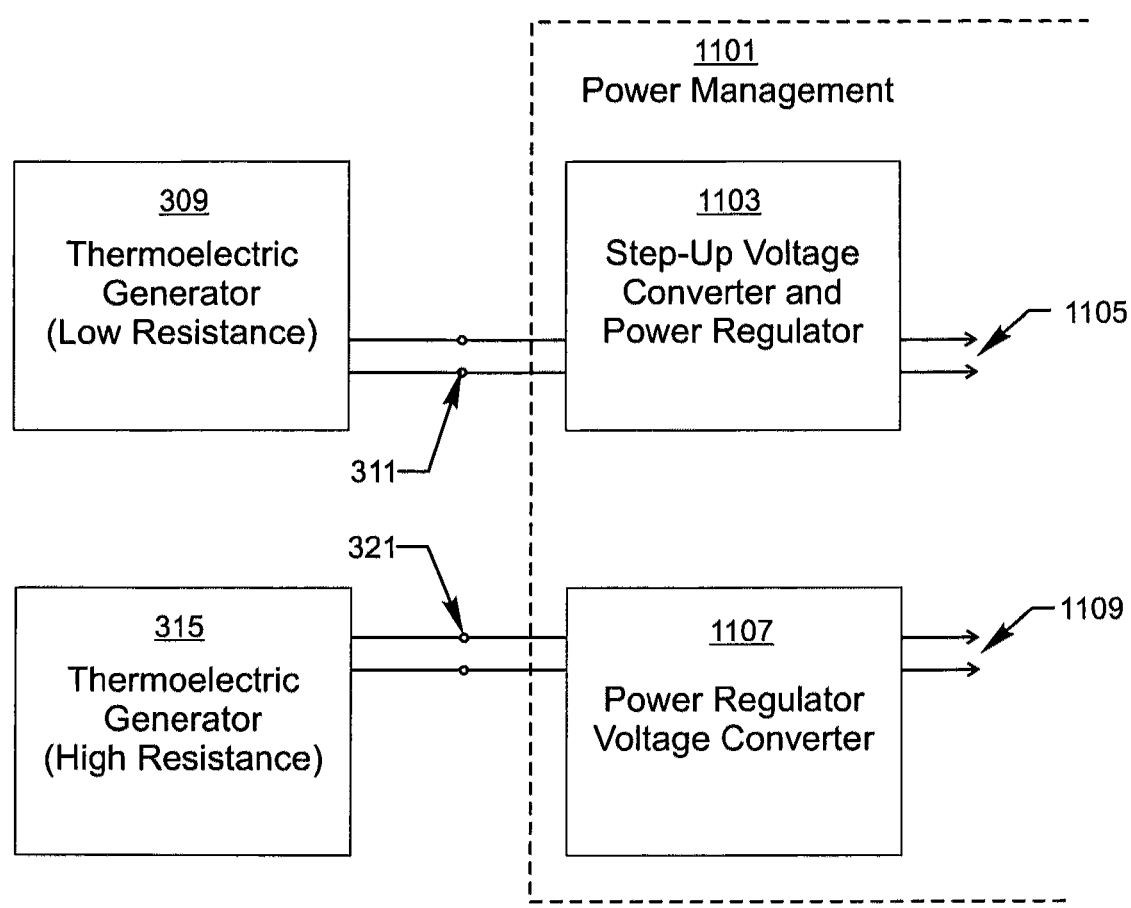
FIG. 11 is a block diagram of electronic control circuitry that may be employed in the present invention.

Output from the low thermal resistance thermoelectric generator 309 is coupled from its electrical output terminals 311 to an electric power manager 1101, as shown in the block diagram of FIG. 11. Likewise the output of the high thermal resistance thermoelectric generator 315 is coupled from its output terminals 321 to the electric power manager 1101. When the ΔT across the low thermal resistance thermoelectric generator is large (as expected during the day portion of the thermal cycle), high current at low voltage is presented to the power manager 1101. To make the most efficient use of this power, a step-up voltage converter 1103 converts this electrical input from the low thermal resistance thermoelectric generator 309 to a higher voltage for use by the electrical load that may be connected to the output 1105 of the step-up converter 1103. A practical implementation of step-up converter 1103, and one usable in the present invention, is a Linear Technologies model 3108 which will turn on at 20 mV to 50 mV with 50% efficiency and drops to 25% efficiency at 200 mV, thus constraining the operating ΔT space or a MAX1723, available from Maxim Inc., which requires an input of 1000 mV' to operate, but operates at a better than 70% efficiency.

When the dual path thermoelectric energy harvester experiences the night portion of the thermal cycle, heat flow is from the energy storage 313 to the environment. If it were allowed, the ΔT across the low thermal resistance thermoelectric generator would be small (the difference in temperature of the energy storage medium and the environment being smaller than during the day portion of the cycle), resulting in a low voltage output at electrical terminals 311, a voltage too low for efficient operation (if any operation at all) of the step-up converter 1103. As explained above, the spectrally selective layer 711 allows efficient absorption of light and infrared energy from an energy source like the sun. The spectrally selective layer 711, however, blocks radiation from an absorber plate 709 when the temperature of the absorber plate is approximately 50° C., such as it is when it is warmed by the stored heat energy of energy storage element 313 during the night portion of the thermal cycle.

The other thermal path of the dual path thermoelectric energy harvester is suited for the low heat flux of the night portion of the thermal cycle. The small ΔT developed across the high thermal resistance thermoelectric generator 315 creates a relatively high voltage at the electrical output terminals 321 of the high thermal resistance thermoelectric generator 315. This voltage is applied to power regulator 1107, which is matched to the output resistance of the high thermal resistance thermoelectric generator, thereby achieving a maximum power transfer from the high thermal resistance thermoelectric generator. Power regulator 1107 has the capability of stepping-up and regulating the input voltage to a higher voltage magnitude with high efficiency, even though the high thermal resistance thermoelectric generator has a high electrical resistance and low current values at terminals 321.

One embodiment employs a model number MAX1724 available from Maxim, Inc. that operates with high efficiency at low current levels output at 1109 to its load. In an alternative embodiment a power regulator having high efficiency at both high and low voltage levels with a capability of matching both high and low resistance values at its input may be used. Alternatively, a non-step up voltage regulator may be used.

Accordingly, a dual thermal path thermoelectric energy harvester has been shown and described. Under conditions of large ΔT when the heat source is supplying energy, a low thermal resistance path generates maximum electrical current as heat energy is stored in a heat energy reservoir. When heat energy is being recovered from the heat energy reservoir and a small ΔT is experienced, a high thermal resistance path generates a lower electrical current but at a higher voltage thereby enabling more efficient operation of the control electronics. The process is to absorb energy at a first band of wavelengths at an absorber plate and store that absorbed energy as thermal energy in a thermal reservoir. A low thermal resistance thermoelectric generator is coupled between the thermal reservoir and the absorber plate and a high thermal resistance thermoelectric generator is coupled between the thermal reservoir and a heat sink. The absorber plate is coated with a spectrally selective layer that prevents radiation from the absorber plate of heat energy at a temperature of the heat sink thereby causing electrical power generation during the night portion of the thermal cycle to be done by the high resistance thermoelectric generator.

What is claimed is:

1. An apparatus for generating electric power from a thermal differential, comprising:
   a thermal reservoir in which thermal energy is stored; and
   a first and a second thermoelectric generators thermally coupled between said thermal reservoir and a spectrally selective heat source terminal and a heat sink terminal, respectively, said first thermoelectric generator having a first thermal resistance and said second thermoelectric generator having a second thermal resistance, said first thermal resistance having a value less than a value of said second thermal resistance.

2. The apparatus of claim 1 wherein said thermal reservoir further comprises a phase change material having a phase transition temperature.

3. The apparatus of claim 2 wherein said phase change material is selected from the group: paraffinic wax and hydrated salts.

4. The apparatus of claim 2 wherein said spectrally selective heat source terminal further comprises an absorber having a first surface upon which is disposed a spectrally selective layer and a second surface, said second surface thermally coupled to said first thermoelectric generator.

5. The apparatus of claim 4 wherein said spectrally selective layer is absorptive in a band of wavelengths encompassing visible and near infrared radiation and is non-emissive in a band of wavelengths encompassing black body peak radiation at temperatures of said thermal reservoir phase change material phase transition temperature.

6. The apparatus of claim 1 further comprising a first heat pipe having proximal and distal ends, said first heat pipe affixed at said proximal end to said first thermal generator such that said first thermal generator is coupled to said thermal reservoir via said first heat pipe.

7. The apparatus of claim 6 wherein said first heat pipe further comprises said first heat pipe having at least one slot disposed therein at said first heat pipe distal end.

8. The apparatus of claim 1 further comprising a second heat pipe having proximal and distal ends, said second heat pipe affixed at said proximal end to said second thermal generator such that said second thermal generator is coupled to said thermal reservoir via said second heat pipe.

9. The apparatus of claim 8 wherein said second heat pipe further comprises a second heat pipe having at least one slot disposed therein at said second heat pipe distal end.

10. The apparatus of claim 8 further comprising a heat sink radiator thermally coupled to said second thermoelectric generator.

11. The apparatus of claim 1 further comprising:
a first heat pipe having an outside diameter value, having a proximal end at said first thermal generator, and having a distal end, a length of said first heat pipe from said proximal end to said distal end having a first magnitude;
a second heat pipe having an inside diameter value, having a proximal end at said second thermal generator, and having a distal end, a length of said second heat pipe from said proximal end to said distal end having a second magnitude;
a housing surrounding said first heat pipe and said second heat pipe and containing a phase change material in thermal contact with said first heat pipe and said second heat pipe,
wherein said inside diameter value is greater than said outside diameter value such that said first heat pipe is disposed within said second heat pipe without contact, and wherein said first magnitude is greater than said second magnitude.

* * * * *